United States Patent
Oklobdzija

(10) Patent No.: US 12,431,871 B2
(45) Date of Patent: *Sep. 30, 2025

(54) SYSTEM OF FREE RUNNING OSCILLATORS FOR DIGITAL SYSTEM CLOCKING IMMUNE TO PROCESS, VOLTAGE AND TEMPERATURE (PVT) VARIATIONS

(71) Applicant: Alliacense Limited, LLC, Discovery Bay, CA (US)

(72) Inventor: Vojin G. Oklobdzija, Berkeley, CA (US)

(73) Assignee: Alliacense Ltd LLC, Discovery Bay, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 18/493,729

(22) Filed: Oct. 24, 2023

(65) Prior Publication Data

US 2024/0243733 A1 Jul. 18, 2024

Related U.S. Application Data

(63) Continuation of application No. 17/877,436, filed on Jul. 29, 2022, now Pat. No. 11,831,316, which is a continuation of application No. 16/900,663, filed on Jun. 12, 2020, now Pat. No. 11,411,553, which is a continuation of application No. 15/939,181, filed on Mar. 28, 2018, now Pat. No. 10,707,839.

(60) Provisional application No. 62/477,865, filed on Mar. 28, 2017.

(51) Int. Cl.
*H03K 3/011* (2006.01)
*H03B 5/24* (2006.01)
*H03L 1/02* (2006.01)
*H03L 7/06* (2006.01)

(52) U.S. Cl.
CPC ............... *H03K 3/011* (2013.01); *H03B 5/24* (2013.01); *H03L 1/02* (2013.01); *H03L 7/06* (2013.01)

(58) Field of Classification Search
CPC .. H03K 3/011; H03B 5/24; H03L 7/06; H03L 1/02
See application file for complete search history.

(56) References Cited

U.S. PATENT DOCUMENTS

| | | | | |
|---|---|---|---|---|
| 5,592,126 A | * | 1/1997 | Boudewijns | H03L 7/00 331/46 |
| 10,707,839 B1 | * | 7/2020 | Oklobdzija | H03B 5/24 |
| 11,411,553 B1 | * | 8/2022 | Oklobdzija | H03L 7/06 |
| 11,831,316 B2 | * | 11/2023 | Oklobdzija | H03B 5/24 |

(Continued)

*Primary Examiner* — Jeffrey M Shin
(74) *Attorney, Agent, or Firm* — Larry E. Henneman, Jr.; Henneman & Associates, PLC

(57) ABSTRACT

A system of free running oscillators synchronized to the lowest frequency running one and following PVT variation generates a system clock. A method is particularly applicable to clock relatively small clock domains within a multi-core chip containing thousands of cores, and where the clock domain encompasses one or more cores and additional logic blocks. The resulting system clock is divided by $2^k$ using latches or flip-flops to achieve a symmetric 50-50 duty cycle of the system clock. Further, such PVT insensitive system clock can be used as a reference for a PLL or DLL generated clock for the domain.

20 Claims, 12 Drawing Sheets

(56) References Cited

U.S. PATENT DOCUMENTS

| | | | | |
|---|---|---|---|---|
| 2002/0003452 A1* | 1/2002 | Mizuno | ............... | H03L 7/0995 |
| | | | | 327/147 |
| 2002/0063605 A1* | 5/2002 | Boerstler | ............ | H03K 3/0315 |
| | | | | 331/177 R |
| 2008/0018408 A1* | 1/2008 | Boerstler | ............... | H03K 5/133 |
| | | | | 331/57 |
| 2011/0148484 A1* | 6/2011 | Kim | ...................... | H03L 7/099 |
| | | | | 327/156 |
| 2016/0072514 A1* | 3/2016 | Tsai | ..................... | H03L 7/0995 |
| | | | | 331/47 |

\* cited by examiner

SYSTEM OF FREE RUNNING OSCILLATORS FOR DIGITAL SYSTEM CLOCKING IMMUNE TO PROCESS, VOLTAGE AND TEMPERATURE (PVT) VARIATIONS

RELATED APPLICATIONS

This application is a continuation of co-pending U.S. application Ser. No. 17/877,436, filed on Jul. 29, 2022 by the same inventor, which is a continuation of U.S. application Ser. No. 16/900,663, filed on Jun. 12, 2020 by the same inventor, which is a continuation of U.S. application Ser. No. 15/939,181, filed on Mar. 28, 2018 by the same inventor, which claims the benefit of U.S. Provisional Patent Application No. 62/477,865, filed on Mar. 28, 2017 by the same inventor, each of which is incorporated herein by reference in its entirety.

BACKGROUND OF THE INVENTION

Field of the Invention

This invention relates generally to clocking digital systems with oscillators, and more particularly to free running oscillators immune to process, voltage, and temperature (PVT) variations.

Description of the Background Art

One of the problems encountered in integrated circuit (IC) design and fabrication is how to deal with variations. Let's suppose that the IC, or "chip" for short, is designed to operate at 5 GHz clock frequency under normal operating conditions—usually referred as TT corner—or nominal conditions. That would mean e.g. operating temperature of 27 degree Celsius, operating voltage of e.g. 1V and nominal processing parameters. However, chip may be exposed to operate under different operating conditions, e.g. The operating temperature may raise up to 105 degree Celsius, the operating voltage may drop to 0.8V instead of 1.0V, and the process parameters may change and produce a "slower" chip, i.e. the one that would fail to operate at 10 GHz, but operate correctly at, e.g. 3 GHz or below. Those variations in operating conditions are referred as: Process, Voltage, and Temperature variations (PVT). In order to assure that the chip coming out of the fabrication will operate in the field, we have to account for the worst possible of the three PVT conditions and assure that the chip will still function correctly. For example, we would design the chip to operate at 10 GHz operating frequency, so that under the worst PVT, the chips will still function at 5 GHz and not fail in the field. This has been known in the integrated circuit design and fabrication field since the beginning, and various computer tools were developed to simulate the IC operation under the worst possible conditions (Worst Corner), in order to assure that the majority of the chips coming out of fabrication will satisfy their operating requirements. Some chips will encounter those conditions and be better than expected. For example, they will come out of the fabrication line operating faster, encounter lower temperature (usually lower temperature results in faster operation), or encounter higher voltage (which has the same effect as lower temperature). The "speeds" (operating frequencies) of the chips coming out of the fabrication line follow a Gaussian like distribution. Some of the chips will operate at higher frequencies than expected and those that fail to operate at 5 GHz and above (e.g.) must be discarded.

Traditionally the operation of the chip (ICs) has been directed by the central clock, which dictates the operating frequency of the chip. The clock is distributed through the chip on a grid or in a tree like fashion. The operation is synchronized with the clock signal, which is referred to as a synchronous operation, i.e. it is said that the chip operates "synchronously", see Uehara, K et al. A Study of an Infrastructure for Research and Development of Many-Core Processors, UPDAS-201. The difference of the frequency for which we need to design the chip operating under nominal/typical conditions and the frequency for which we guarantee the chip operation under worst case is called "margin"—in this case 10 GHz vs. 5 GHz. In terms of the clock period it is 100 pS vs 200 pS—every operation in the chip has to finish in 100 pS, but we have given it an extra 100 pS "margin" in case the worst of the possible conditions are encountered. (Analogy to that would be if it takes 30 minutes to drive from A to B, and one would leave 1 hour earlier just counting that there could be a traffic jam or an accident on the road.)

There are two scenarios which make this problem bad today and even worse in the future:
  (a) As the technology scales into smaller geometries e.g. 16 nm, 7 nm today and even 5 nm and 3 nm in the future, the margins are taking 30-50% of the available clock period. Therefore, we are wasting half of the available time, just in case worst conditions are encountered.
  (b) As the trend in chip design is to use more of the processor "cores" (core being a processor unit), the number of processors on the chip is reaching hundreds and even thousands of processors in the future: e.g. 2,048, 4,096 or more.
  (c) Recently, devices are starting to exhibit change of parameters over time (e.g., during the life span of the chip the performance may slow down). This is referred to as aging effects. Thus, additional margining is necessary to overcome aging effects.

It is becoming difficult to clock thousands of processors on the silicon die all in a synchronous fashion and all with increasing process variations, or the margins are becoming big.

Process Variations

Fabrication process variations can be further categorized into several categories:
  (a) There are differences between different batches of silicon wafers being processed at the same fabrication facility. Those are referred to as "batch-to-batch" or "run-to-run" variations.
  (b) Within each "run" there are variations between silicon wafers, referred to as "wafer-to-wafer" variations.
  (c) Each silicon wafer contains hundreds of "chips" or "dies" and they come out differently. Those variations are referred to as "die-to-die" or "chip-to-chip" variations.
  (d) Within each silicon die (chip) there are different areas of the chip that are receiving different exposure during the fabrication process, and different areas of the chip will exhibit different characteristics. Those are referred as "intra-die" variations.

We have seen many attempts in the past to design chips that will operate in "asynchronous" instead of "synchronous" fashion, with claims that "asynchronous" design can overcome all the problems listed here. However, all those attempts failed to produce competitive or workable/credible results.

In June of 1995 Charles Moore filed for a patent application which was issued on Sep. 15, 1998 as U.S. Pat. No. 5,809,336, known as the '336 patent. This patent describes a single ring oscillator clocking the processor, while the processor is communicating with the outside of the chip components synchronously under a control of a crystal clock. One of the drawbacks of this patent is that if the ring oscillator happens to be in the part of the chip least affected by PVT, the parts of the chip, which are in regions of the chip affected by PVT will fail to operate.

An object of the present invention is to provide a flexible, yet synchronous/asynchronous clocking system that will adapt to the changing situation due to the PVT variations.

SUMMARY

This invention provides a system of free running oscillators (FROs) that are adopting to the PVT variations and providing the clock signal to provide synchronization within an entire chip, or more specifically within a core or clock domain (one of many) on the chip. The free running oscillators can be implemented as ring oscillators or any other implementation that follows PVT variations in frequency. Ring oscillator is one of many possible implementations of the FRO, and it is used for purposes of example throughout this disclosure. In the actual implementation, it is suggested that the utilized FROs are made of the same logic blocks that exist in the critical path of the design, i.e. the critical paths should be replicated with output tied to the input providing free running oscillations. Such an FRO has the closest behavior to the critical path in tracking PVT effects on the elements contained within the boundaries of the core.

Further, the resulting clock signal is always running at the lowest frequency of all frequencies provided by free running oscillators. That means that the core or clock domain within the chip is clocked at the frequency determined by the worst PVT region within the chip. The term "clock domain" designates the region of the chip (single or multiple cores) that is being clocked by the described arrangement. The resulting clock signal will be designated as the "system clock".

BRIEF DESCRIPTION OF THE DRAWINGS

The present invention is described with reference to the following drawings, wherein like reference numbers denote substantially similar elements.

DETAILED DESCRIPTION

The present invention overcomes problems associated with the prior art. In the following description, numerous specific details are set forth in order to provide a thorough understanding of the invention. Those skilled in the art will recognize, however, that the invention may be practiced apart from these specific details. In other instances, details of well-known clocking practices and components have been omitted, so as not to unnecessarily obscure the present invention.

The following references are incorporated herein by reference:
1. V. G. Oklobdzija, et al, *Digital System Clocking: High Performance and Low-Power Aspects*, Wiley-IEEE, (2005); and
2. V. G. Oklobdzija, "*Clocking and Clocked Storage Elements in a Multi-Gigahertz Environment*," IBM Journal of Research and Development, (2003), vol. 47, no. 5/6, pp. 567-584.

Figure 1:
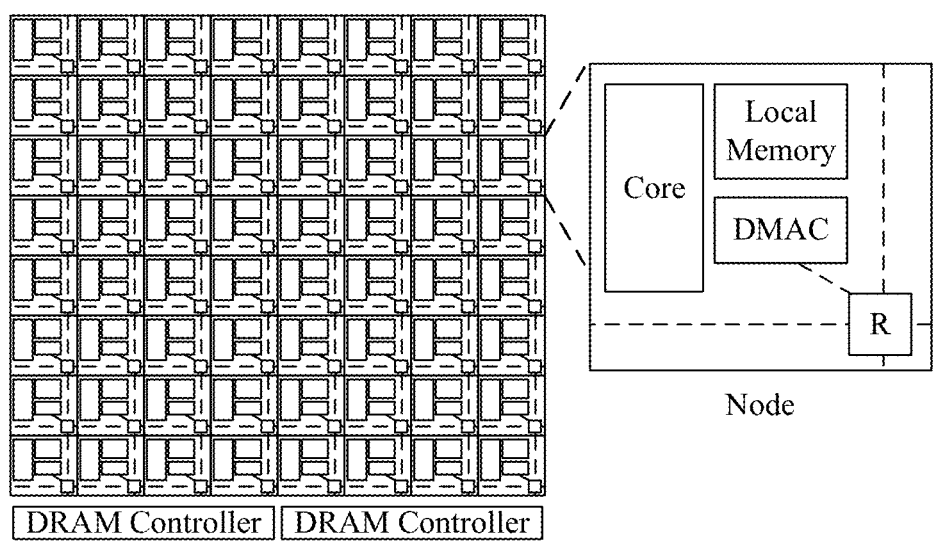
FIG. 1 shows a silicon chip divided into multiplicity of clock domains.

FIG. 1 shows the silicon chip divided into a multiplicity of clock domains that could be cores or regions containing more than a single core. An example of such a system is taken from the open literature (Uehara).

FIG. 1 also shows an example of a clock domain, in this case consisting of one core, local memory, DMAC and associated Router. The example is taken from the open literature (Uehara).

Figure 2:
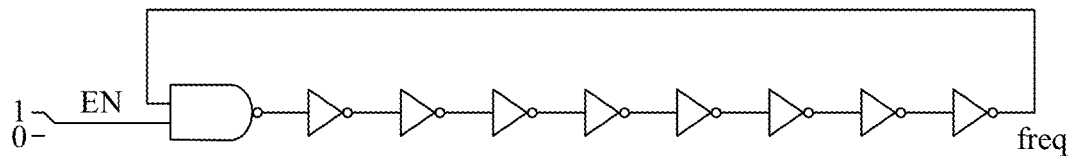
FIG. 2 shows a free running oscillator (FRO)

FIG. 2 shows a free running oscillator (FRO) (implemented as a ring oscillator in this case). The operation of the ring oscillator is controlled by the Enable signal (EN). When EN=0 the ring oscillator is not oscillating and it is in a predetermined known state. When EN=1, the ring oscillator is oscillating at the frequency determined by the delay of the elements in its path (invertors in shown case), which is dependent on PVT.

Figure 3A:
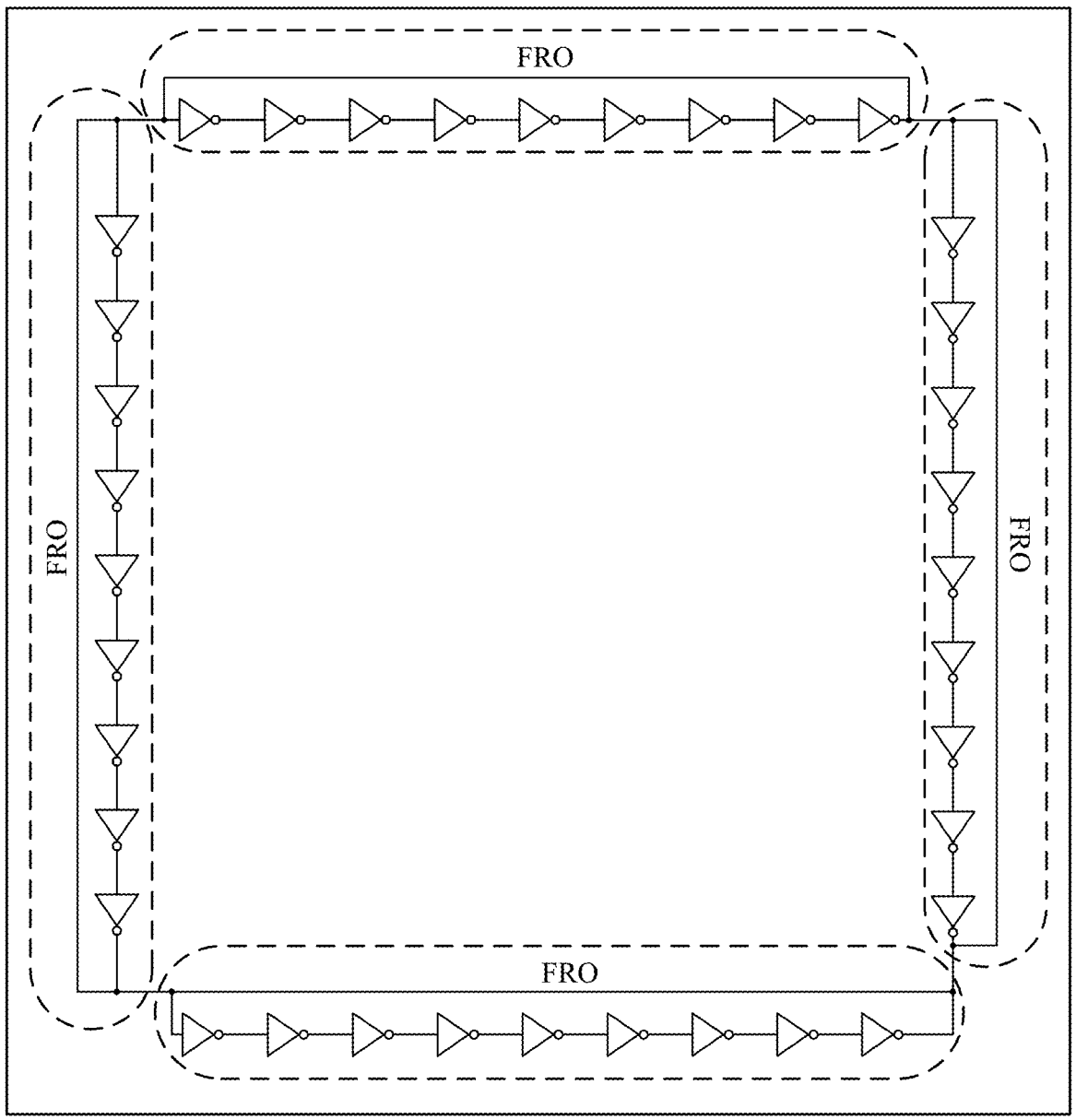
FIG. 3A shows an example of multiple FROs.

FIG. 3A shows an example of free running oscillators, elements of which are dispersed across the clock domain (in this particular case, around the boundary of the domain). The FROs are interconnected via a grid, which forces the FROs to synchronize to the average frequency and PVT conditions. The grid is further interconnected into a well-known "clock mesh" for distributing the system clock within the domain.

Figure 3B:
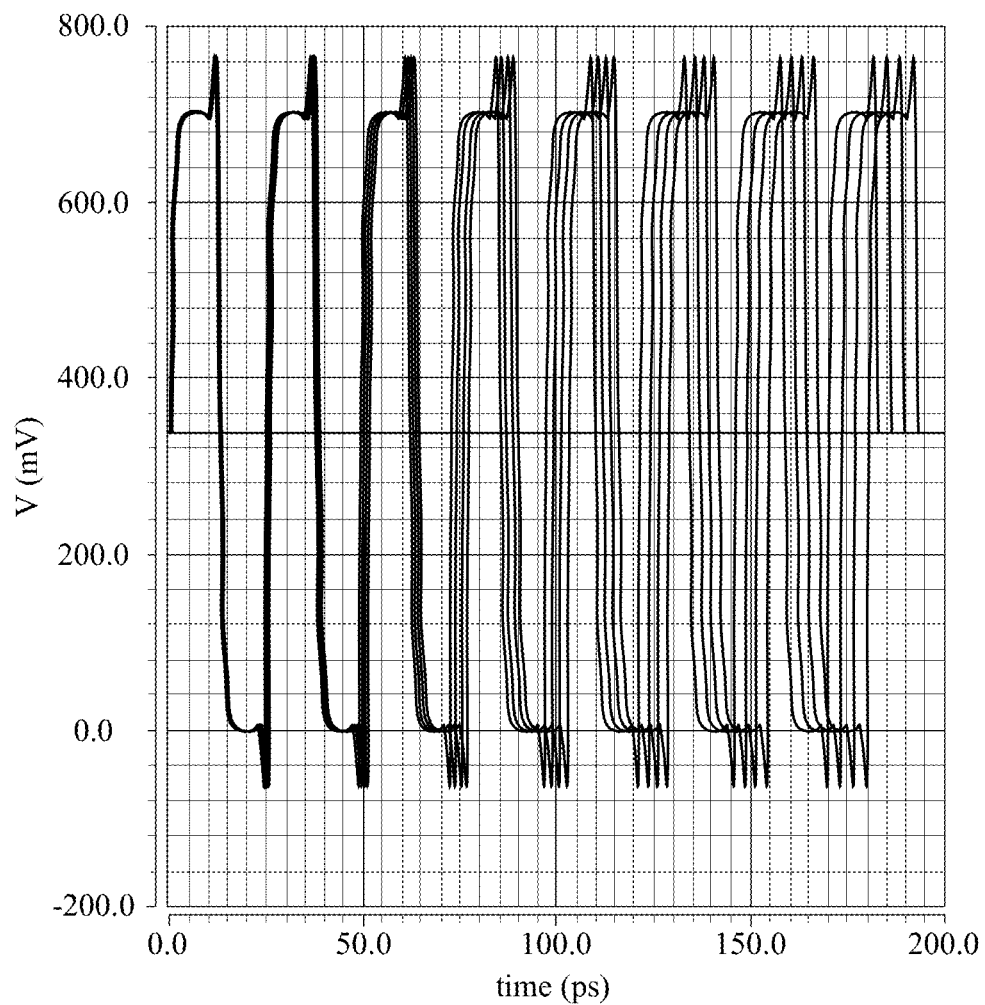
FIG. 3B shows simulation results of an experiment conducted using Cadence CAD simulation tool on the FROs shown in FIG. 3A disconnected from one another.
Figure 3C:
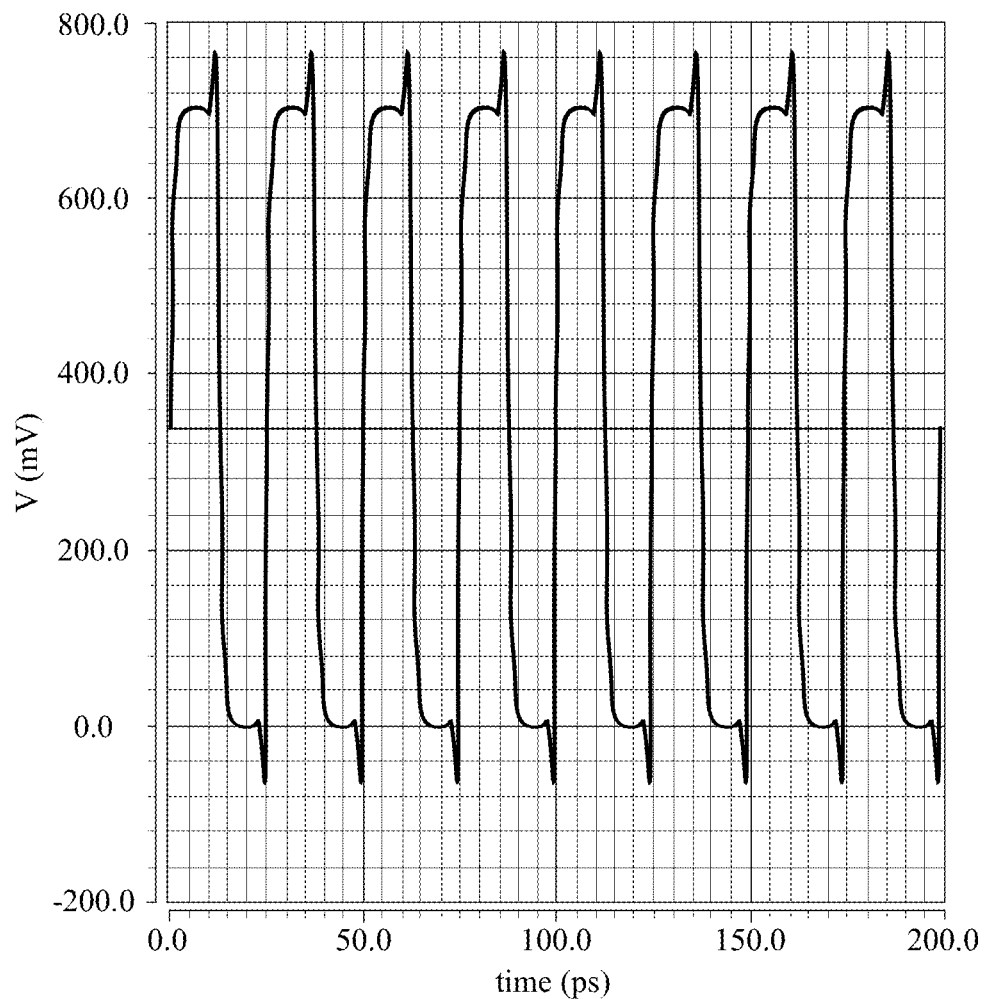
FIG. 3C also shows simulation results of an experiment conducted using Cadence CAD simulation tool on the structure (connected FROs) shown in FIG. 3A.

FIGS. 3B and 3C show simulation results of an experiment conducted using the Cadence CAD simulation tool on the structure shown in FIG. 3A. FIG. 3B shows the signal waveform of four free running oscillators (from FIG. 3A) when they are not connected via grid (i.e. the grid is disconnected). The FROs are running at their own frequencies (they are intentionally made to be different to simulate process variations). FIG. 3C shows their signals when they are connected via the grid. FIG. 3C shows how the signals are perfectly synchronized to each other and can be used as the system clock, which has a frequency that varies with PVT.

Figure 4A:
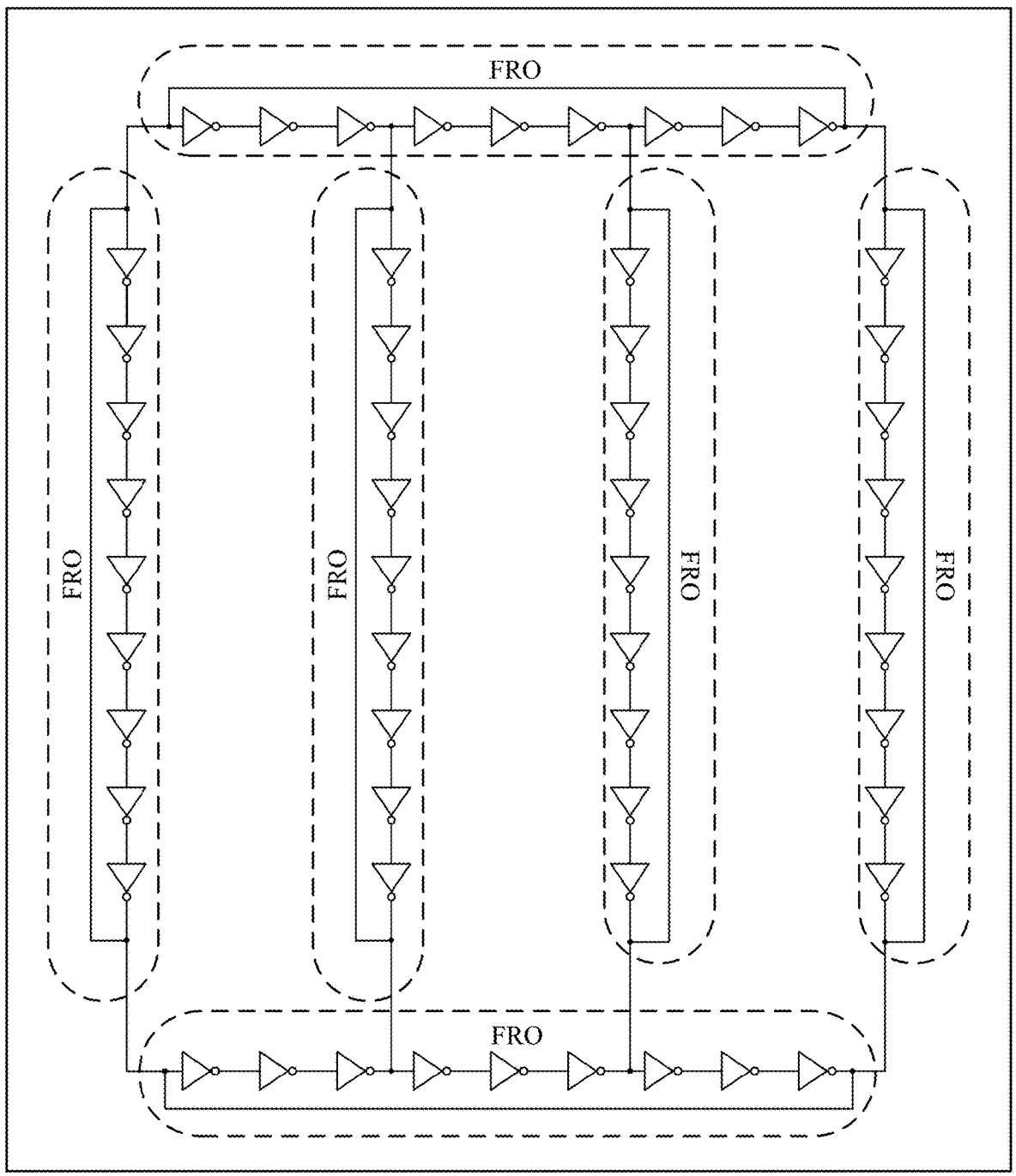
FIG. 4A shows another topology of a system of FROs.
Figure 4B:
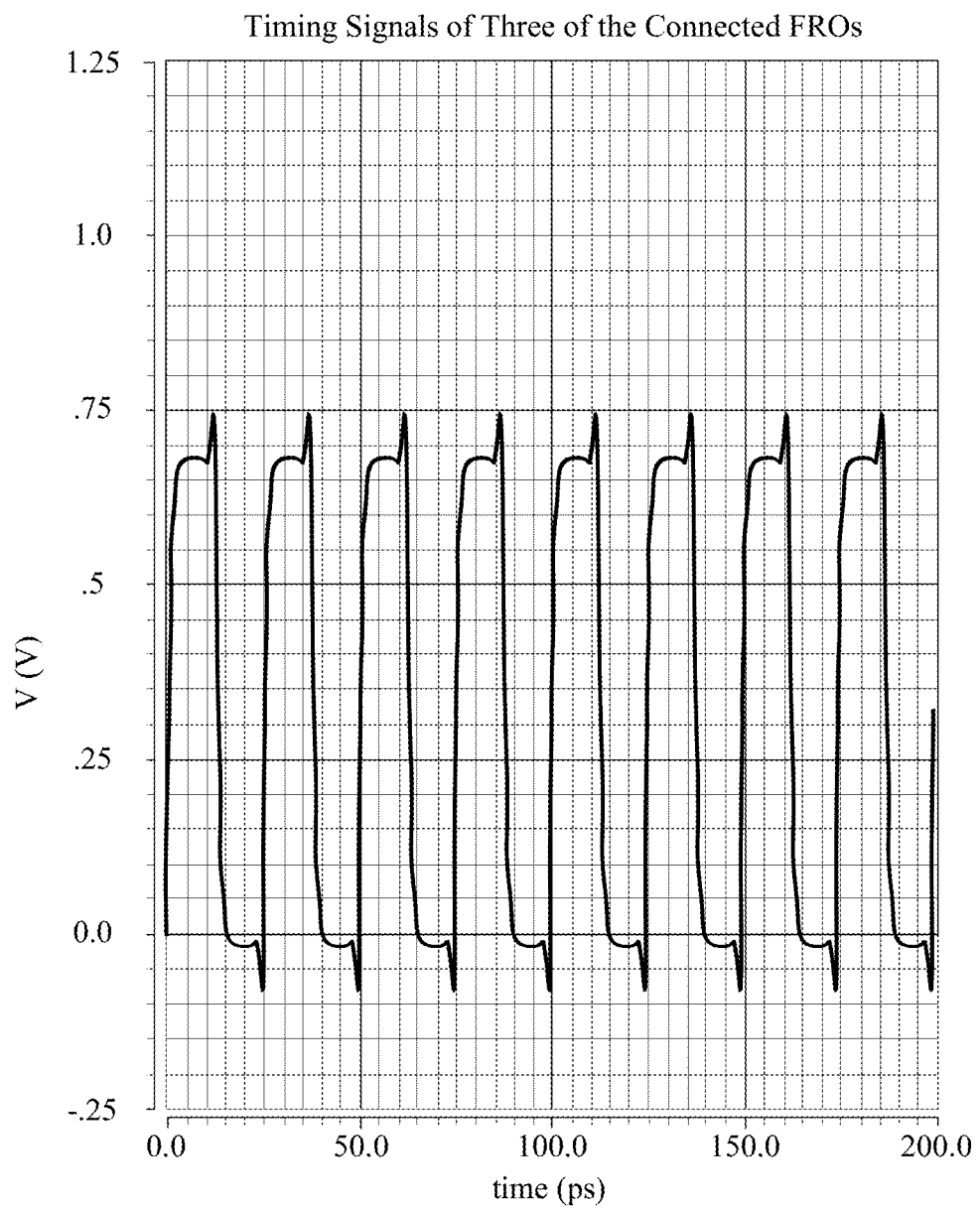
FIG. 4B shows the clock signals originating from three of the FROs shown in the structure of FIG. 4A.
Figure 4C:
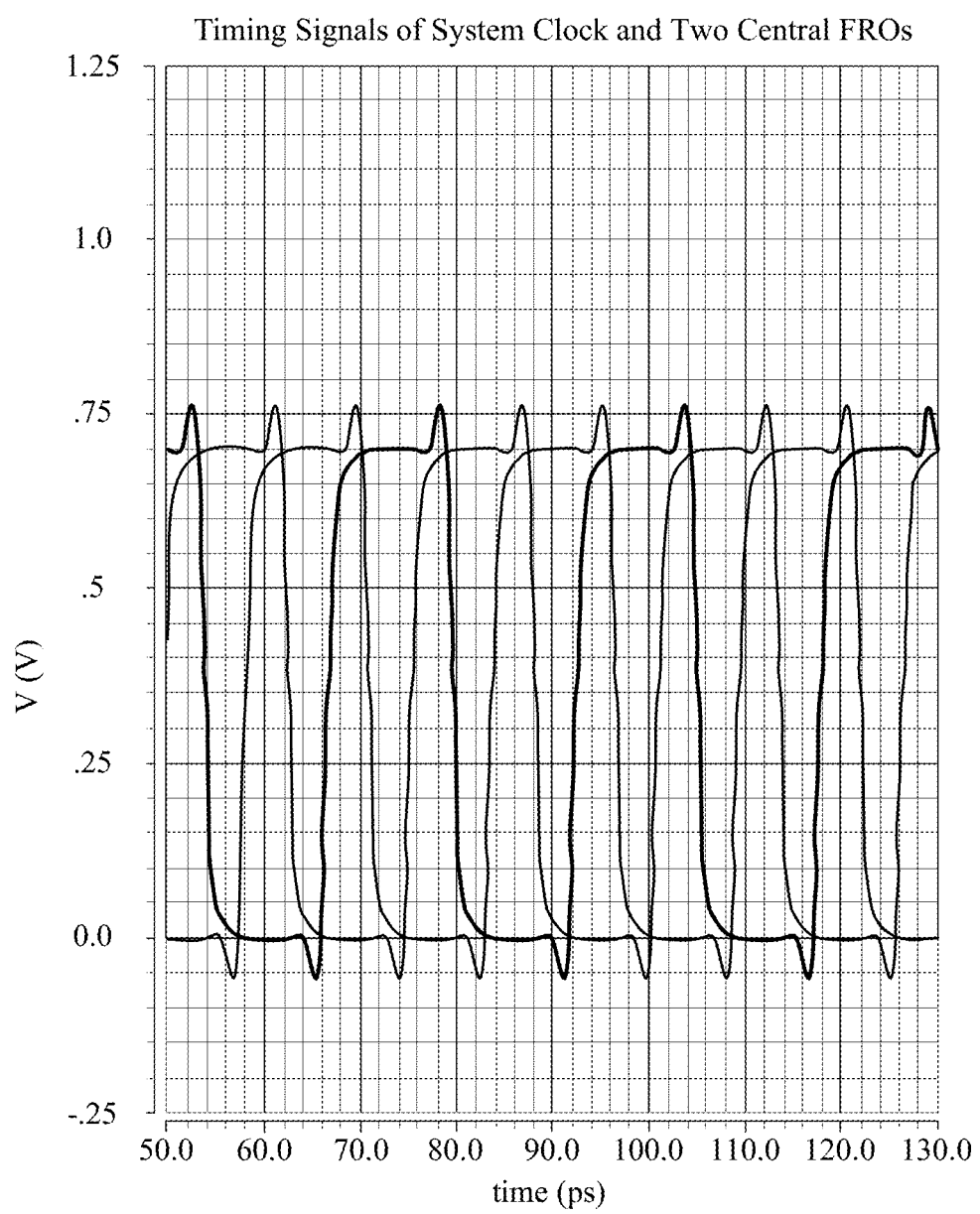
FIG. 4C shows clocking signals from the main system clock (emphasized) and two signals from the two FROs in the middle of the domain.

FIG. 4A shows another topology of the system of FROs dispersed throughout the clock domain in a way that can capture all the areas of the domain and associated PVT variations. FROs are interconnected at various points, forcing them to synchronize. Though FIG. 4A shows six FROs synchronized together, the number of FROs utilized in such a configuration is not limited to six and can include many more FROs. FIG. 4B shows the clock signals originating from three of the FROs shown in the structure described in FIG. 4A. We can observe how they are perfectly synchronized generating the system clock. FIG. 4C shows the main system clock (emphasized) and two signals from the two FROs in the middle of the domain. The experiment shown in FIGS. 4A-4C demonstrates that the system described is operational.

Figure 5A:
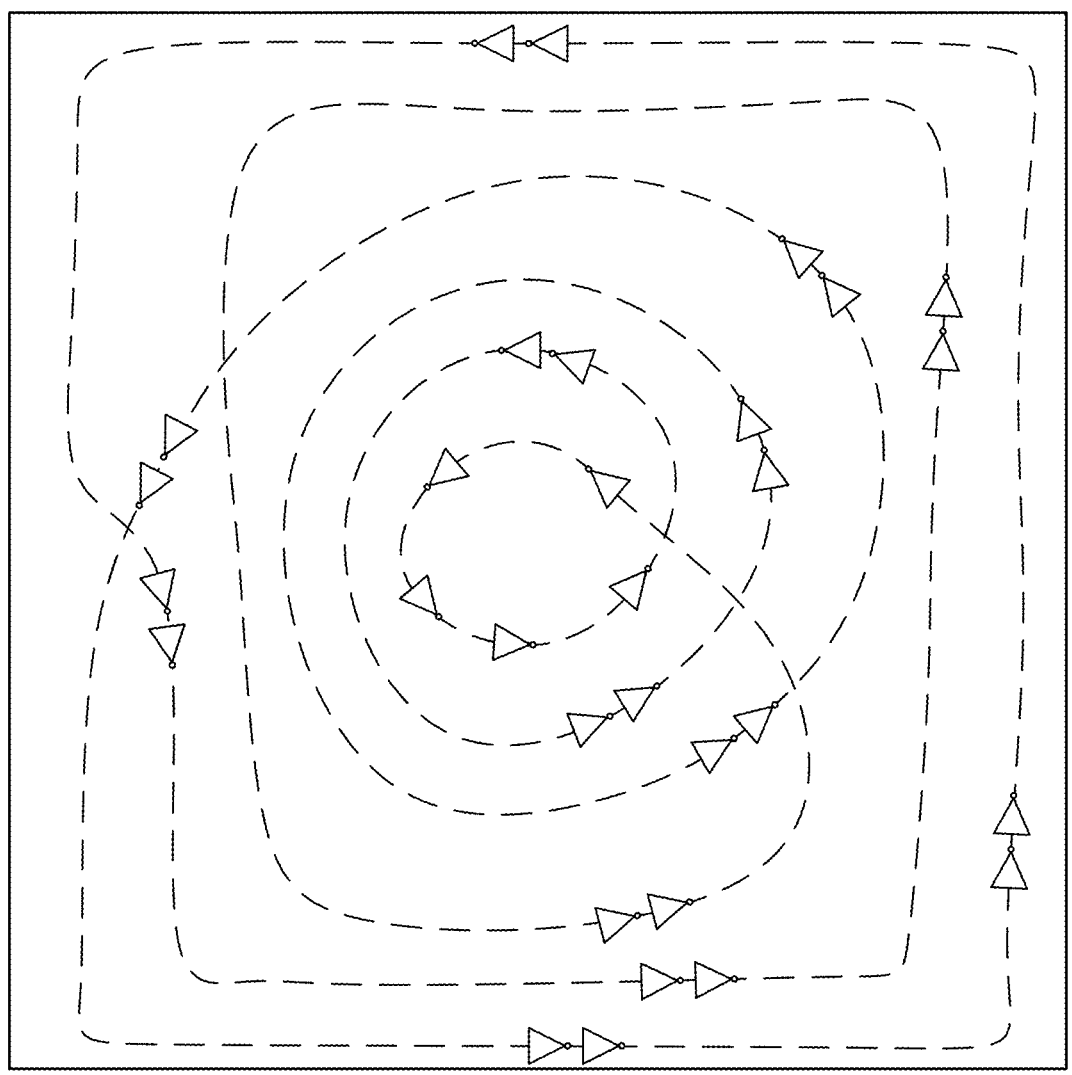
FIG. 5A shows a possible topology for placing FROs within the domain.
Figure 5B:
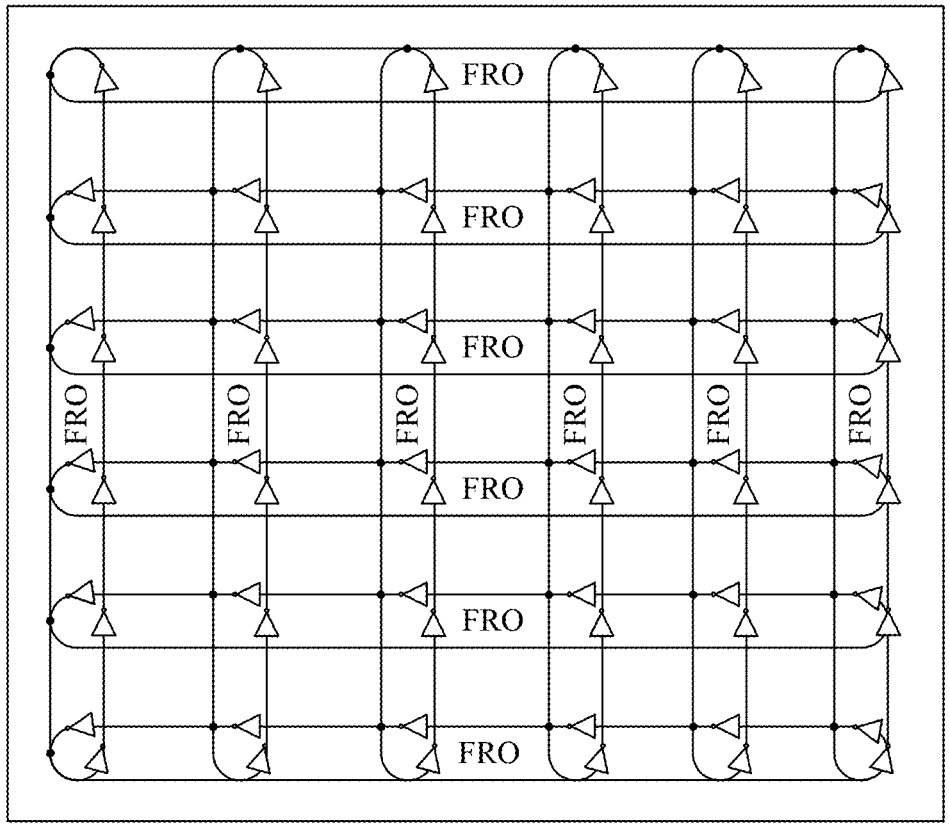
FIG. 5B shows another possible topology for placing FROs within the domain.

FIG. 5A shows another possible topology for placing FROs within the domain. The invention described in FIGS. 1-5B shows a system of free running oscillators that is synchronized by the application of a grid. (i.e. by tying all the FROs outputs together) The clock signal in this case runs at the frequency that represents an average frequency of FROs in the system, and the frequency follows PVT variations in the domain. When using such an arrangement in a design, timing of the critical path still has to allow for a small margin, which is due to the process parameter variation across various points of the domain, though, such a margin is considerably smaller than the margin used across the entire chip (die). However, this invention will alleviate all other variations, aging effects included.

Figure 6:
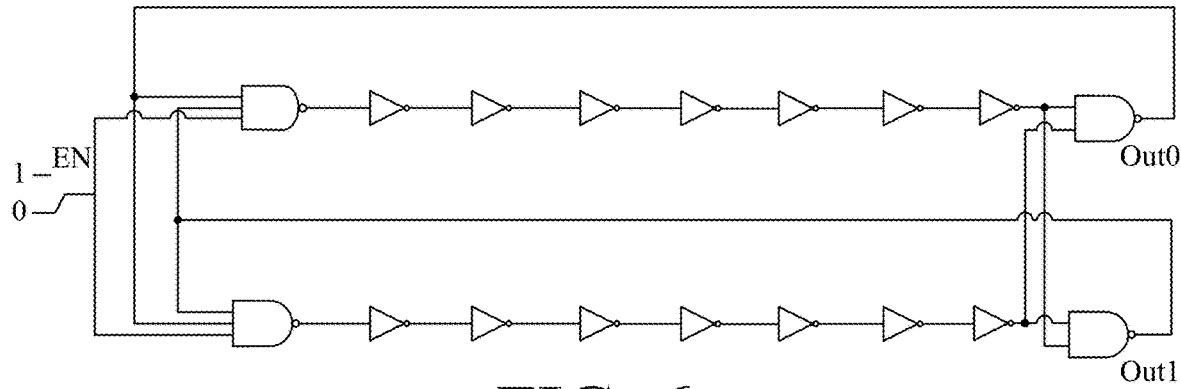
FIG. 6 shows two FROs that are linked with each other.
Figure 7:
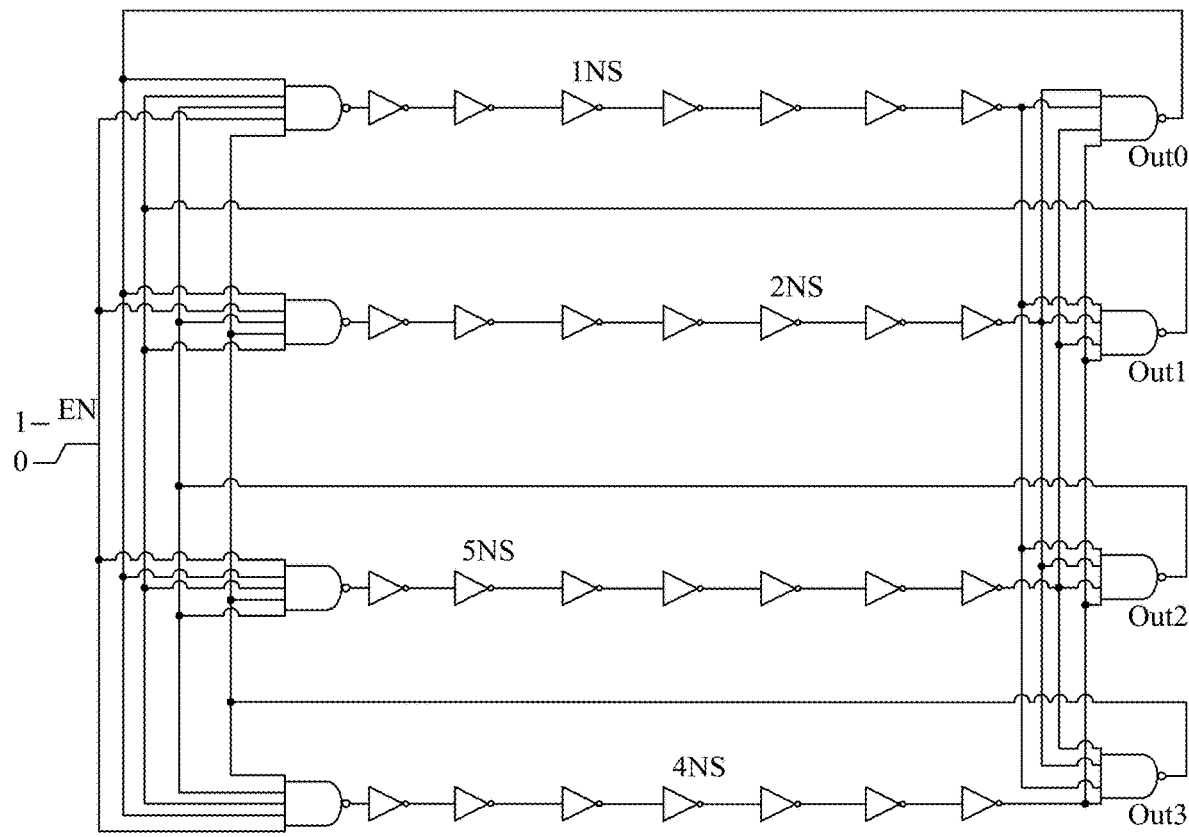
FIG. 7 shows an arrangement of four oscillators in a domain.

The systems described here force the resulting system clock to run at the lowest frequency of all the FROs within the clock domain. This operation is illustrated in the example of two FROs synchronized to run at the lower frequency of the two, as shown in FIG. 6. FIG. 6 illustrates two FROs that are linked with each other in such a way that the frequency of the slower of the two FRO dominates. The number of FROs that can be synchronized to the frequency of the lowest is not limited to two FROs, and we can use as many as practicably feasible and sufficient for achieving our goal. FIG. 7 illustrates an arrangement of four such oscillators in a domain, producing the system clock running at the lowest frequency attainable due to PVT in the domain.

In all the instances described, FROs are controlled by an Enable signal (EN). When EN=0 FROs are prevented from oscillating. When EN=1, the FROs are enabled to oscillate. Further, as EN is a common signal to all of them, it provides a determined starting point for all of the FROs, thus any "races" to synchronize with each other are avoided. Additional Enable signals can be used to turn off particular regions of the chip (clock gating).

Figure 8:
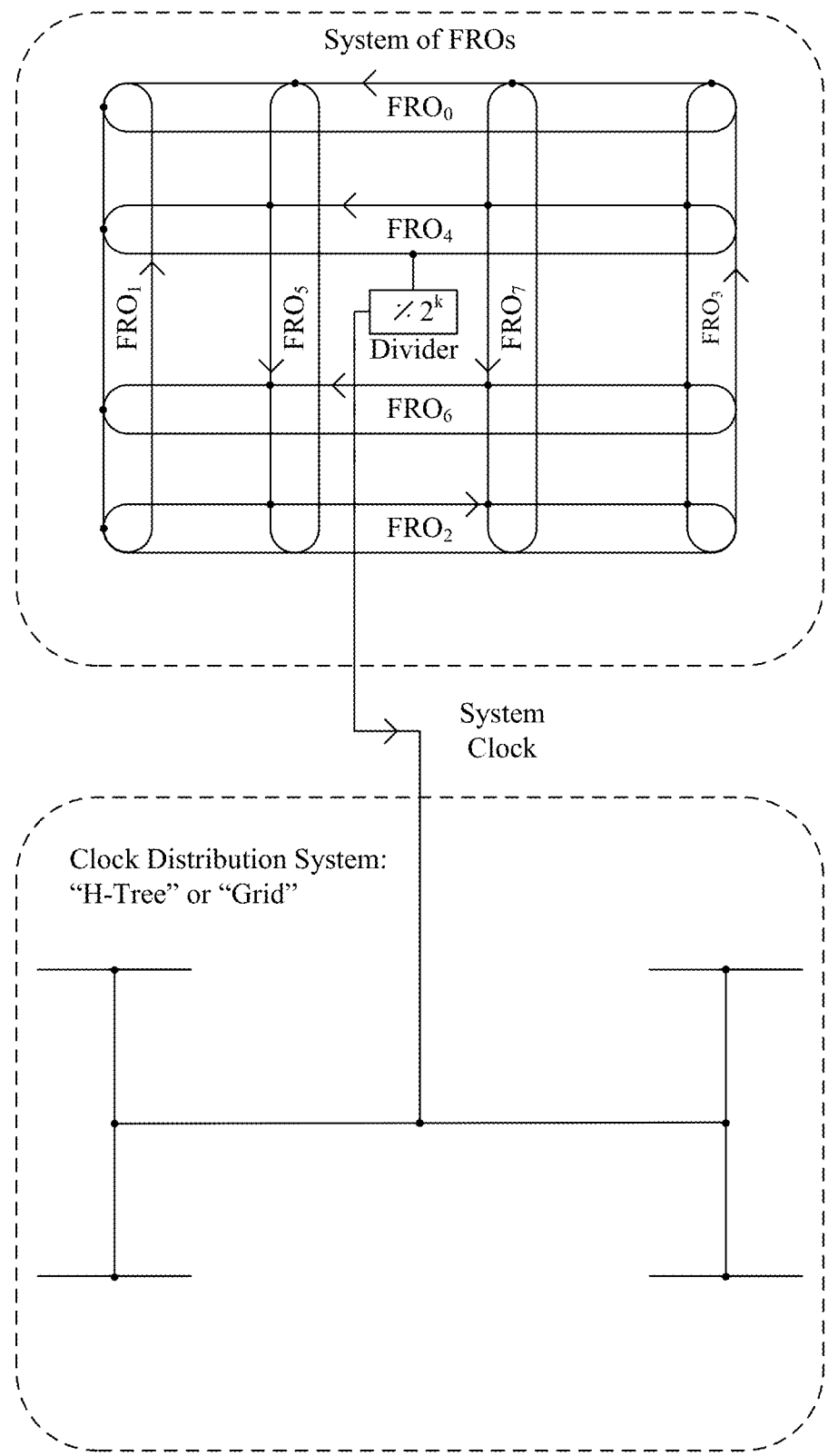
FIG. 8 shows a system that generates a system clock with near perfect 50-50 clock duty cycle.

The resulting signal of the system of FROs shown in FIG. 6 (running at the frequency dictated by the slowest FRO in the system) does not produce a "symmetric" clock signal, i.e. the clock signal with the 50-50 "duty cycle". When this feature is desired and necessary, the system of FROs is set to run at the frequency that is twice or four times as fast as the desired system clock frequency. The desired frequency is obtained by dividing the clock signal by the factor of 2 or 4 (or factor $2^k$ in general). This generates the system clock with near perfect 50-50 clock duty cycle. This is illustrated in FIG. 8.

Figure 9:
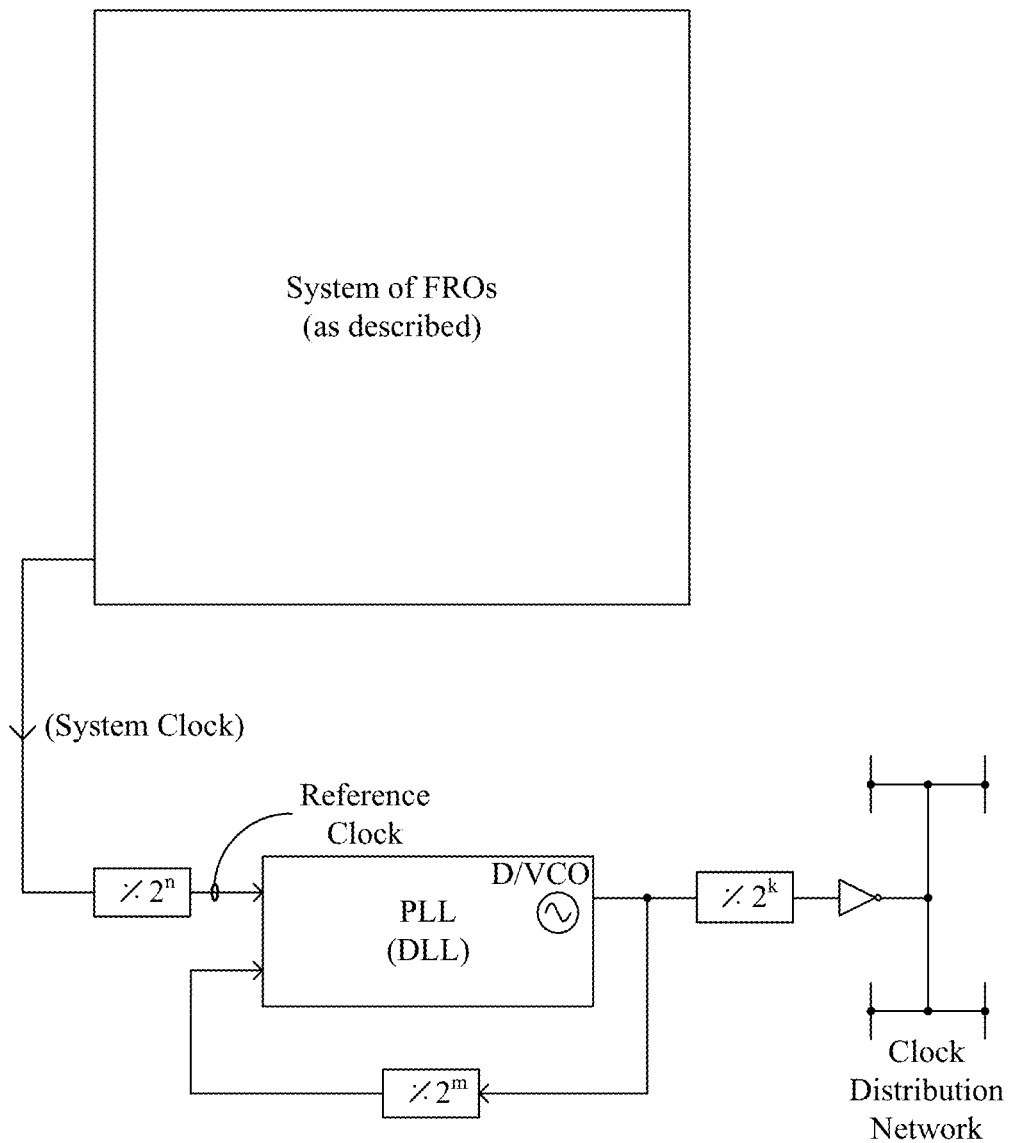
FIG. 9 shows a system of FROs that provide a reference point for phase locked loop (PLL) or digital locked loop (DLL) clocking in a domain.

It is further possible to use a described system of FROs to provide a reference point for PLL or DLL in the domain. Thus, the system can follow standard design flow, using PLL or DLL, while the reference clock provides a signal that follows PVT. The PLL or DLL can then provide the system clock signal that is following the reference signal by a factor introduced by PLL/DLL. This arrangement is illustrated in FIG. 9. Communication between domains (e.g. cores) is performed in asynchronous fashion since each domain is clocked synchronously by its own system clock independent of each other.

The description of particular embodiments of the present invention is now complete. Many of the described features may be substituted, altered or omitted without departing from the scope of the invention. Various deviations from the particular embodiments shown will be apparent to those skilled in the art, particularly in view of the foregoing disclosure.

I claim:

1. An integrated circuit chip comprising:
   an integrated circuit substrate;
   an integrated circuit comprising a first plurality of circuits and a second plurality of circuits, said first plurality of circuits formed in said integrated circuit substrate within a first defined area of said integrated circuit substrate, said second plurality of circuits formed in said integrated circuit substrate within a second defined area of said integrated circuit substrate, said first defined area spaced apart from said second defined area;
   a plurality of ring oscillators including a first ring oscillator formed in said first defined area of said integrated circuit and a second ring oscillator formed in said second defined area of said integrated circuit substrate, said ring oscillators being connected to each other; and
   a clock distribution system connected to said first plurality of circuits and said second plurality of circuits of said integrated circuit; and wherein
   said first ring oscillator and said second ring oscillator are connected to said clock distribution system.

2. The integrated circuit chip according to claim 1, wherein the plurality of ring oscillators are interconnected to provide a clock speed at an interconnection to said clock distribution system which is an average of the speed of said plurality ring oscillators.

3. The integrated circuit chip according to claim 1, wherein the plurality ring oscillators are interconnected to provide a clock speed at an interconnection to said clock distribution system which is the lowest speed of said plurality ring oscillators.

4. The integrated circuit chip according to claim 1, wherein the plurality ring oscillators are spaced and arranged within said integrated circuit substrate in a pattern such that each of said first ring oscillator and said second ring oscillator substantially spans the integrated circuit.

5. The integrated circuit chip according to claim 4, wherein the pattern is interleaved.

6. The integrated circuit chip according to claim 4, wherein the pattern is a spiral.

7. The integrated circuit chip according to claim 3, wherein each of the plurality of ring oscillators comprises an odd number of inverters and at least one of said inverters of each ring oscillator of the plurality ring oscillators is a NAND gate.

8. The integrated circuit chip according to claim 7, wherein a first NAND gate of each of the ring oscillators has at least one input connected to the output of another of said plurality of ring oscillators.

9. The integrated circuit chip according to claim 7, wherein a last NAND gate of each ring oscillator of the plurality ring oscillators has at least one input connected to a second to last inverter of another ring oscillator of said plurality of ring oscillators.

10. An integrated circuit chip comprising:
an integrated circuit substrate;
an integrated circuit comprising a plurality of circuits formed in said integrated circuit substrate and spanning a defined area of said integrated circuit substrate;
a first free running oscillator (FRO) including a first set of integrated devices formed in said integrated circuit substrate;
a second FRO including a second set of integrated devices formed in said integrated circuit substrate, said first set of integrated devices being mutually exclusive of said second set of integrated devices, said first FRO being connected to said second FRO; and
a clock distribution system connected to said plurality of circuits of said integrated circuit; and wherein
said first FRO and said second FRO are coupled to provide a clock signal to said clock distribution system.

11. The integrated circuit chip of claim 10, wherein:
said first FRO is a ring oscillator; and
said second FRO is a ring oscillator.

12. The integrated circuit chip of claim 10, wherein the connection between said first FRO and said second FRO synchronizes the speeds of said first FRO and said second FRO.

13. The integrated circuit chip of claim 12, wherein the connection between said first FRO and said second FRO synchronizes the phases of said first FRO and said second FRO.

14. The integrated circuit chip of claim 10, further comprising an additional plurality of FROs all interconnected with said first FRO and said second FRO.

15. The integrated circuit chip of claim 10, wherein:
said first FRO is a first ring oscillator; and
said second FRO is a second ring oscillator.

16. The integrated circuit chip of claim 15, wherein:
said first ring oscillator includes a first set of inverters; and
said second ring oscillator includes a second distinct set of inverters.

17. The integrated circuit chip of claim 16, wherein:
at least one of said inverters of said first set of inverters is a first NAND gate; and
at least one of said inverters of said second set of inverters is a second NAND gate.

18. The integrated circuit chip of claim 17, wherein said output of said first NAND gate is connected to said input of said second NAND gate.

19. The integrated circuit chip of claim 10, further comprising a frequency divider coupled between said interconnected first and second FROs and said clock distribution system.

20. The integrated circuit chip of claim 10, wherein said frequency divider is operative to divide by a factor of $2^k$ to produce a 50-50 clock duty cycle.

* * * * *